United States Patent [19]
Pan et al.

[11] Patent Number: 5,479,126
[45] Date of Patent: Dec. 26, 1995

[54] METHOD AND APPARATUS FOR PROGRAMMABLE DAMPING FACTOR OF A PHASE LOCKED LOOP

[75] Inventors: Tzu-Wang Pan, Irvine; Jenn-Gang Chern, Yorba Linda, both of Calif.

[73] Assignee: Silicon Systems, Inc., Tustin, Calif.

[21] Appl. No.: 483,499

[22] Filed: Jun. 7, 1995

Related U.S. Application Data

[63] Continuation of Ser. No. 241,271, May 9, 1994, abandoned.

[51] Int. Cl.$^6$ ............................. H03K 5/13; H03K 5/22
[52] U.S. Cl. ............................. 327/157; 327/148; 327/7; 327/551; 331/17
[58] Field of Search ..................... 331/14, 17; 327/165, 327/147, 148, 149, 153, 156, 157, 158, 161, 236, 244, 5, 7, 361, 355, 354, 359, 554, 551

[56] References Cited

U.S. PATENT DOCUMENTS

| | | | |
|---|---|---|---|
| 3,218,557 | 11/1965 | Sanders | 327/5 |
| 4,524,333 | 6/1985 | Iwata et al. | 327/156 |
| 5,021,749 | 6/1991 | Kasai et al. | 331/14 |
| 5,170,130 | 12/1992 | Ichihara | 327/157 |

*Primary Examiner*—Timothy P. Callahan
*Assistant Examiner*—Dinh T. Le
*Attorney, Agent, or Firm*—Hecker & Harriman

[57] ABSTRACT

A timing acquisition circuit using a phase locked loop with programmable damping for either Type A or Type B phase detectors is described. In the damping scheme for a Type A phase detector, a resistance (R1) is simulated by adding an equivalent voltage Veff to the capacitor voltage. The equivalent voltage Veff is generated internally, so that programmable damping is made possible. In Type B phase detectors, a variable gain amplifier is used to control the effective resistance (R1) of the loop filter.

11 Claims, 4 Drawing Sheets

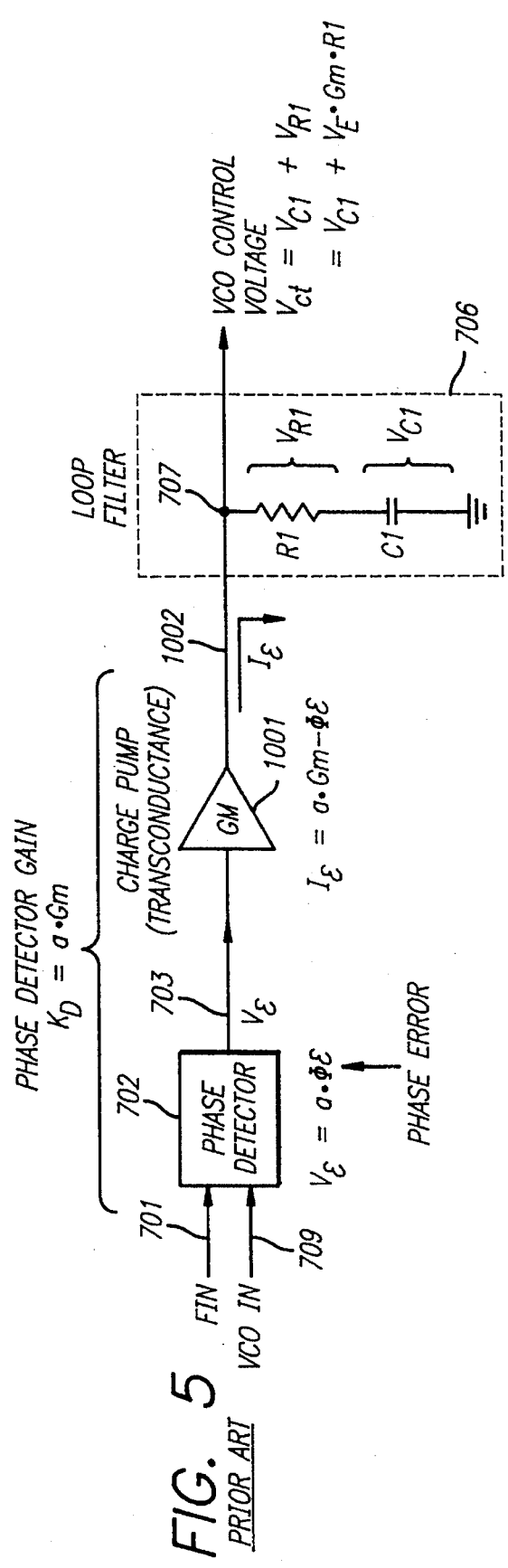
FIG. 5 *PRIOR ART*
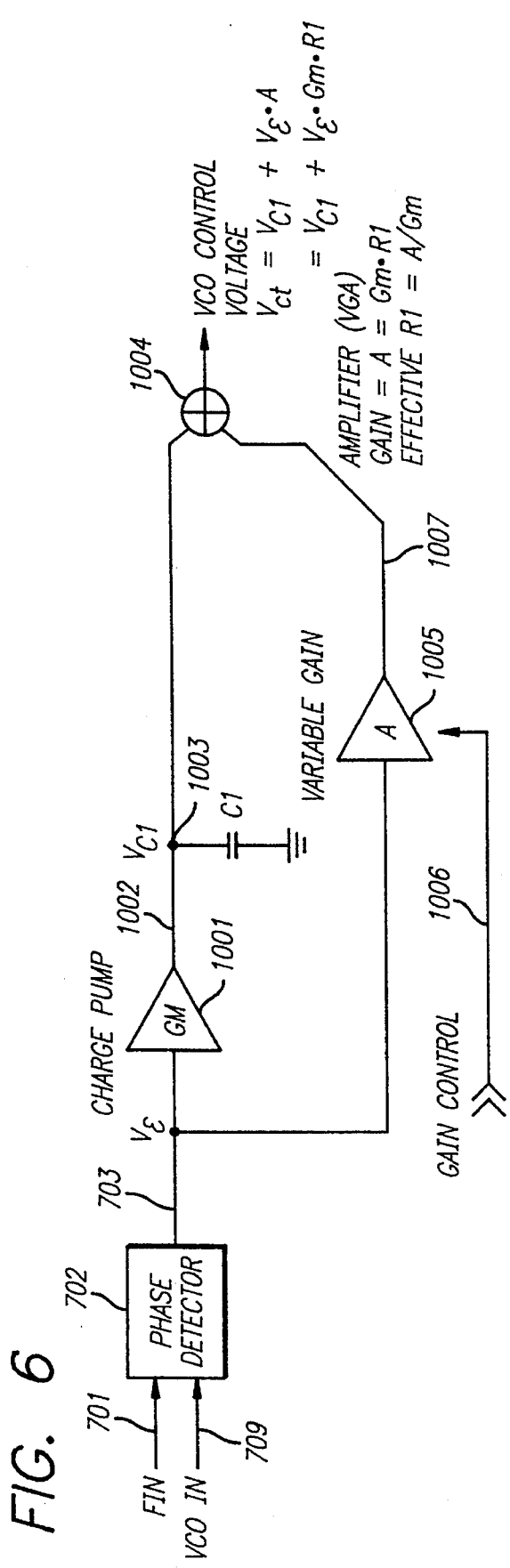
FIG. 6

METHOD AND APPARATUS FOR PROGRAMMABLE DAMPING FACTOR OF A PHASE LOCKED LOOP

This is a continuation of application Ser. No. 08/241,271 filed on May 9, 1994 and now abandoned.

BACKGROUND OF THE INVENTION

1. Field of the Invention

This invention relates to the field of data recording and detecting schemes.

2. Background Art

In computer systems, information is stored on magnetic storage systems such as Winchester type hard disks or floppy disks. Data is stored in a series of spiral or concentric rings known as "tracks". The data consists of streams of transitions of polarity of magnetic particles on the disk surface. A number of schemes are used to detect these transitions and data.

One prior art data detection method is a peak detection system. A disadvantage of peak detection schemes is limited data density. Another prior art data detection scheme is known as partial-response class IV (PR-IV) signaling. Systems using PR-IV schemes can achieve higher recording density than the conventional peak detection systems.

In PR-IV systems, input signals are sampled before performing symbol sequence detection. An example of a prior art PR-IV decoder is illustrated in FIG. 1. An input signal is coupled to one terminal of switch 101. The other terminal of switch 101 is coupled to node 102. Node 102 is coupled as an input to symbol sequence detector 103. The output 104 of symbol sequence detector 103 is decoded data. Node 102 is also coupled to a timing recovery circuit indicated by dashed line 105. Timing recovery circuit 105 is comprised of phase detector 106, loop filter 108 and VCO 110. Node 102 is coupled as an input to phase detector 106. The output 107 of phase detector 106 is coupled as an input to loop filter 108. Loop filter 108 provides an output 109 to VCO 110. The output 111 of VCO 110 is a sampling clock signal that controls switch 101.

The timing recovery circuit 105 is required to adjust the clock signal for the sampler so that frequency drifts between oscillators in the send and receive circuits can be compensated for. This timing recovery circuit is typically a phase-locked loop (PLL) consisting of a sampled-data phase detector. The phase detector determines the phase error between the input signal and a VCO by computing the timing gradient from the sampled data values. Timing recovery is described in K. H. Mueller and M. Muller, "Timing Recovery in Digital Synchronous Data Receivers", *IEEE Trans. Commun.*, vol. COM-24, pp. 516–530, May, 1976 and in F. Dolivo etc. in U.S. Pat. No. 4,890,299 entitled *"Fast Timing Acquisition for Partial-Response Signaling"*, and *"Fast Timing Recovery for Partial-Response Signaling Systems"*, F. Dolivo, W. Schott, and G. Ungerbock, IEEE International Conference on Communications, June, 1989, pages 573–577.

Data decoders use phase locked loops to aid in timing recovery. Phase-locked loops (PLL) are essential building blocks for modern communication and storage products. A typical PLL consists of a voltage controlled oscillator (VCO), a phase detector and a loop filter. For many integrated circuits applications, the loop filters are often implemented with external discrete R, C components.

FIG. 2 is a block diagram of a prior art phase locked loop. An input signal Fin 701 is provided as one input into a phase detector 702. The output 703 of phase detector 702 is provided as an input to charge pump 704. Charge pump 704 provides an output 705 to a loop filter, indicated by dashed line 706. Loop filter 706 is external and is coupled to the charge pump at node 707. Node 707 is coupled to ground through resister R1 and capacitor C1. Node 707 provides a VCO Control Voltage Vct as an input to VCO 708. VCO 708 provides an output 709 which is coupled in a feedback loop as a second input to phase detector 702.

Two important parameters are often used to describe the stability and convergence time of a PLL: natural frequency $\omega n$ and damping factor $\zeta$. For the commonly used simple RC loop filter shown in FIG. 7, these values are determined by:

$$\omega n = \sqrt{\frac{KdKv}{C1}}$$

$$\zeta = \frac{KdKvR1}{2\omega n}$$

where Kd is the phase detector gain and Kv is the VCO gain.

In many cases, it is very desirable to be able to dynamically change the value of R1. Since R1 is an external component, it is difficult to change its values once it has been chosen.

There are prior art systems that use MOSFETs to switch between different resistor components to change the R1 value. This approach can only have a very limited number R1 values and usually introduces severe disturbance into the loop when switching between components. Also, for integrated circuit applications, this approach requires more pins to accommodate different R1's, and thus increases the cost of the device.

SUMMARY OF THE INVENTION

A timing acquisition circuit using a phase locked loop with programmable damping for either Type A or Type B phase detectors is described. In the damping scheme for a Type A phase detector, a resistance R1 is simulated by adding an equivalent voltage Veff to the capacitor voltage. The equivalent voltage Veff is generated internally, so that programmable damping is made possible. In Type B phase detectors, a variable gain amplifier is used to control the effective resistance R1 of the loop filter.

BRIEF DESCRIPTION OF THE DRAWINGS

FIG. 5 illustrates a prior art Type B phase detector.

FIG. 6 illustrates a programmable damping circuit of the present invention for Type B phase detectors.

DETAILED DESCRIPTION OF THE INVENTION

A method and apparatus for programmable damping architecture is described. In the following description, numerous specific details are set forth in order to provide a more thorough understanding of the present invention. It will be apparent, however, to one skilled in the art, that the present invention may be practiced without these specific details. In other instances, well-known features have not been described in detail in order not to unnecessarily obscure the present invention.

Phase Locked Loop Implementation

Two types of phase detectors are proposed in the present invention. The programmable damping scheme is described for each type. Schemes for other types of phase detectors may be derived in a similar way.

Type A

Figure 1:
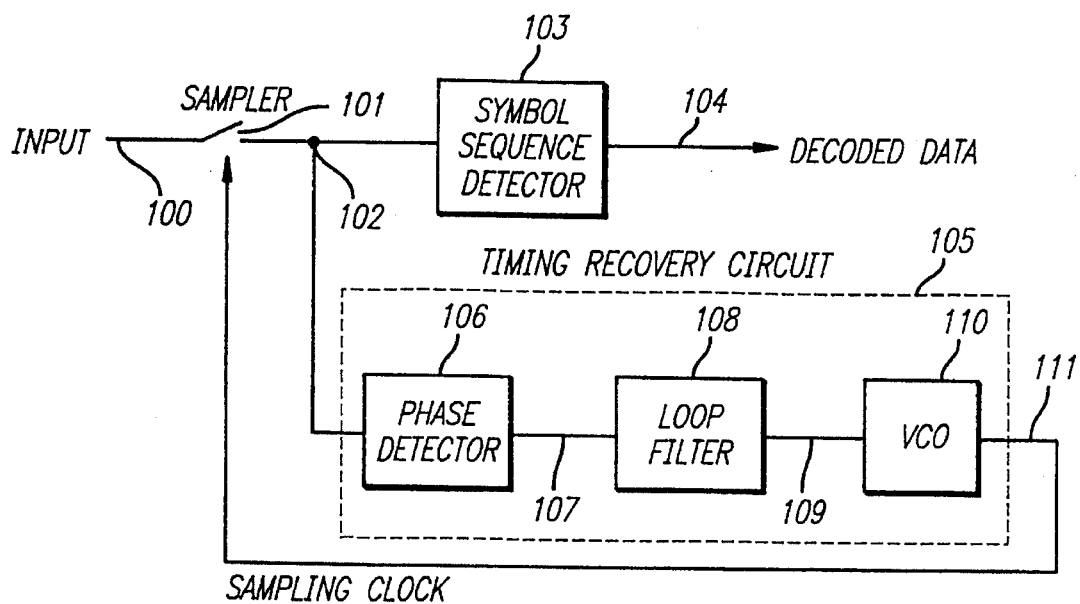
FIG. 1 illustrates an example of a prior art PR-IV decoder.
Figure 2:
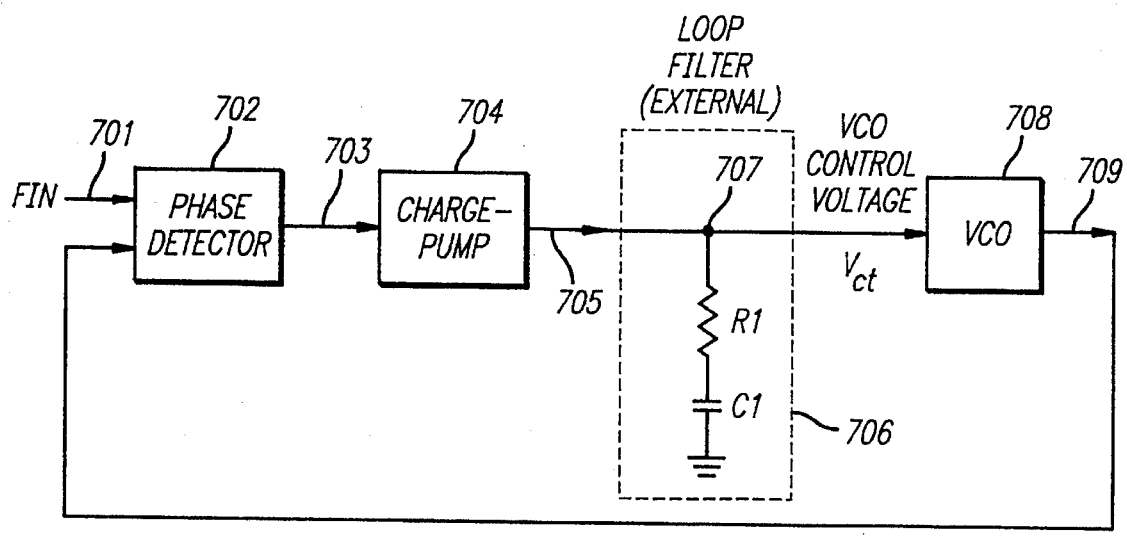
FIG. 2 illustrates a prior art phase locked loop.
Figure 3:
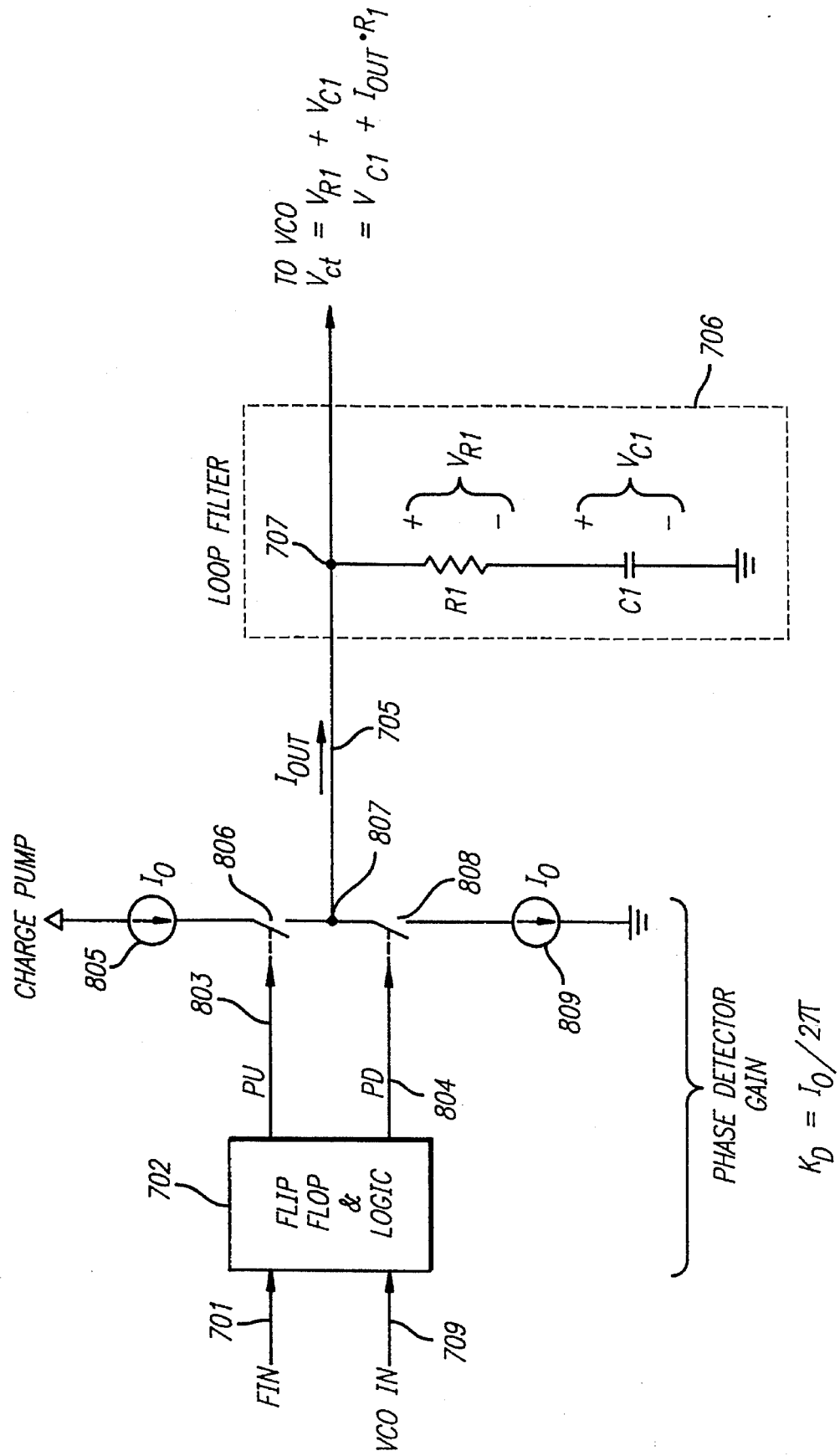
FIG. 3 illustrates a prior art Type A phase detector.

One popular type of phase detector is a flip-flop type frequency/phase detector (Type A) shown in FIG. 3. Input signal Fin 701 and VCO in signal 709 are inputs to flip flop and logic block 802. Flip flop and logic block 802 provide two outputs a pump up signal PU 803 and a pump down PD 804. Pump up signal PU 803 controls switch 806. Switch 806 couples and decouples current source 805 to node 807. Pump down PD 804 control switch 808. Switch 808 couples and decouples node 807 to ground through current source 809. Node 807 provides I out signal 705 to the loop filter 706. The I out signal 705 is coupled to node 707. Node 707 is coupled to ground through resistor R1 with a voltage drop of $V_{R1}$ and capacitor C1 with a voltage drop of $V_{C1}$. Signal VCT is taken from node 707 and is equal to $V_{R1}+V_{C1}$ which in turns=$V_{C1}$+ I out (R1).

The width of the output current pulse is proportional to the phase error between the two inputs, while the polarity of the current indicates the direction of error. Note that the output voltage of the loop filter (Vct) is equal to the voltage drop on R1 plus the voltage drop on C1 because R1 and C1 are in series.

Figure 4:
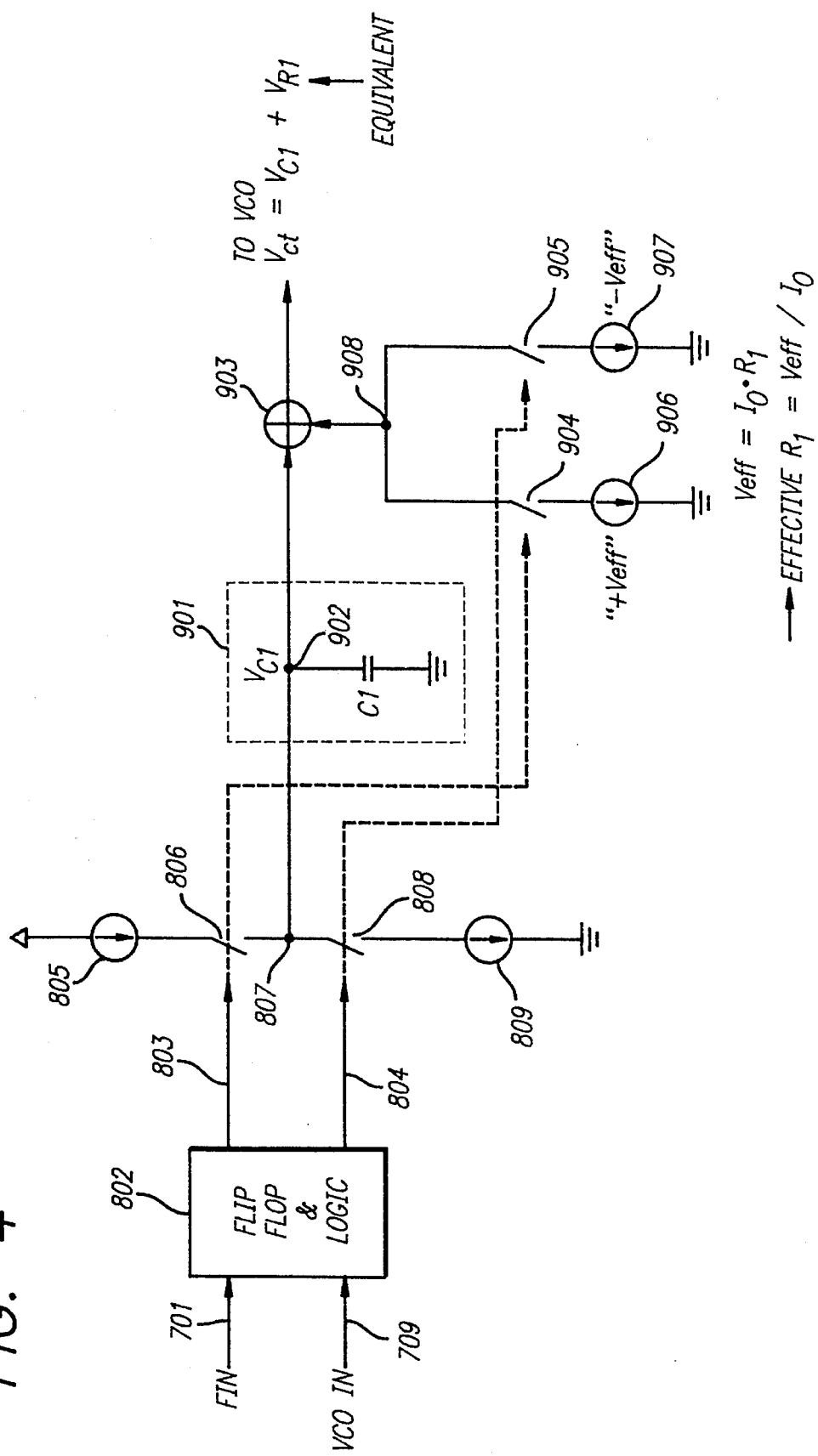
FIG. 4 illustrates a programmable damping circuit of the present invention for Type A phase detectors.

FIG. 4 illustrates a circuit for programmable damping for Type A phase detectors. Input signal Fin 701 and VCO in signal 709 are provided as inputs to flip flop and logic block 802. Logic block 802 provides pump up signal 803 and pump down signal 804 to control switches 806 and 808, respectively. Pump up signal 803 also controls switch 904 and pump down signal 804 controls switch 905. Switch 806 couples and decouples current source 805 to node 807. Switch 808 couples and decouples node 807 to current source 809. Node 807 is coupled to filter 901. Filter 901 includes node 902 coupled to node 807. Node 902 is coupled to ground through capacitor C1. Node 902 is also coupled to summing node 903. Switch 904 couples and decouples voltage source +Veff 906 to node 908. Switch 905 couples and decouples node 908 to voltage source −Veff 907. Node 908 is coupled to summing node 903. The output of node 903 is voltage Vct=$V_{C1}+V_{R1\ (EQ)}$. The voltage Veff=Io (R1). Effective R1=Veff/Io.

$V_{R1(EQ)}$ = +*Veff*, when switch 906 is ON

−*Veff*, when switch 907 is ON 0, when both switch 906 and 907 are OFF.

In the embodiment of FIG. 4, Instead of connecting R1 with C1, R1 is 'simulated' by adding an equivalent voltage (Veff=IoR1) to the capacitor voltage. Therefore, the two approaches generate the same control voltage for VCO. The effective value of R1 can be adjusted by changing the level of the voltage source Veff.

Type B

Another type of phase detector (Type B) is often used in sampled data systems, for example, PRML (Partial Response Maximum Likelihood) channels for hard disk drives. Such a scheme is described in K. H. Mueller and M. Muller, "Timing recovery in digital synchronous data receivers," *IEEE Trans. Commun.*, vol. COM-24, pp. 516–530, May 1976. A type B phase detector is illustrated in FIG. 5. Input signal Fin 701 and VCO in signal 709 are provided as inputs to phase detector 702. Phase detector provides an output 703 to transconductance type charge pump 1001. Charge pump 1001 provides an output 1002 to loop filter 706. Signal 1002 is coupled to node 707. Node 707 is coupled through resistor R1 and capacitor C1 to ground. Node 707 provides VCO control voltage Vct as output.

The magnitude of the phase detector output is directly proportional to the phase error. The charge pump is an analog transconductance block with the output current directly proportional to the input voltage. For this type of phase detector, R1 is simulated with a variable gain amplifier.

FIG. 6 illustrates programmable damping for the Type B phase detector of FIG. 5. Input signal Fin 701 and Vco 709 are coupled to phase detector 702. The output 703 of phase detector 702 is coupled to the transconductance charge pump 1001 and to a variable gain amplifier 1005. The output 1002 of charge pump 1001 is coupled to node 1003. Node 1003 is coupled through capacitor C1 to ground. Node 1003 is also coupled to summing node 1004. A gain control signal 1006 controls the gain of variable gain amplifier 1005. The output 1007 of variable gain amplifier 1005 is coupled to summing node 1004. The output of summing node 1004 is VCO control voltage Vct.

By changing the gain of this amplifier 1005, the effective resistance R1 of the loop filter can be changed. The programmable damping scheme of FIG. 6 permits several different types PLL design. These include a PLL with a wide frequency range, and a PLL at different modes of operation.

PLL with Wide Frequency Range

For applications such as disk drive constant density recording and frequency synthesis, the same PLL has to lock to different ranges of frequencies. In this case, Kd and Kv are made proportional to the VCO center frequency (ωo), so that ωn is also proportional to ωo. In this manner, the number of clock cycles required for the loop to converge remains constant.

Fore example, let Kv=K1ωo, and Kd=K2ωo where K1 and K2 are two constants. Thus $$\omega n = \sqrt{\frac{KdKv}{C1}} \quad \omega o = \left(\sqrt{\frac{K1K2}{C1}}\right)$$

is proportional to the VCO center frequency.

Kd can be made proportional to ωo for Type A phase detectors by tracking the charge pump current Io with the VCO center frequency ωo, i.e.:

$$Kd = \frac{Io}{2\pi} = K2\omega o$$

thus:

$$I_o = 2\pi K_2 \omega o$$

For Type B phase detectors, the transconductance value Gm is made to track ωo.

$$Kd = aGm = K_2 \omega o$$

and $$Gm = K_2 \omega o / a$$

However, while tracking Kd and Kv with ωo, the damping factor is then set by $$\zeta = \frac{KdKvR1}{2\omega n} = \frac{R1\sqrt{KdKvC1}}{2} = \frac{R1\omega o \sqrt{K_1 K_2 C1}}{2}$$

That is, the damping factor changes with the center frequency, if both R1 and C1 are fixed. This may be undesirable, because it is desired to maintain the damping factor at approximately 0.7 for the adequate loop performance.

The programmable damping scheme can be used to solve this problem. Because ζ is to be constant, effective R1 values are programmed to be inversely proportional to ωo. Since the value of Io or Gm of the phase detector is made proportional to ω, the Veff or Aeff in the programmable damping scheme is actually a constant value.

$$Veff = IoR1 = (2\pi K_2 \omega o) \frac{2\zeta}{\omega o \sqrt{K_1 K_2 C1}} = 4\pi \zeta \sqrt{K_2/(K_1 C1)}$$

or, $$Aeff = GmR1 = (K_2 \omega o / a) \frac{2\zeta}{\omega o \sqrt{K_1 K_2 C1}} = (2/a)\zeta \sqrt{K_2/(K_1 C1)}$$

Note that Veff and Aeff only depend on the desired damping factor ζ and the external C1. They are independent of ωo. This results a very simple and stable PLL system where con tracks the PLL operating frequency and the damping factor also stays constant.

PLL at Different Modes of Operation

For many data synchronizer applications, there is usually a training period for the PLL before the actual data is received. During the training period, a higher ωn for the loop is desired so that the loop can converge quickly. While in the data tracking period, a lower ωn value is desired so that the jitter can be reduced. This is usually achieved by 'gear-shifting' the charge pump or transconductance, i.e. changing the value of Io or Gm so that Kd and ωn change accordingly.

Again, gear shift will change the damping factor of the loop and degrades loop performance in either the acquiring mode or the tracking mode of the PLL. By introducing the programmable damping scheme this change is compensated for by programming the effective R1 value. The PLL is kept at its optimal performance in both operation modes.

Thus, a method and apparatus for timing acquisition of partial response class IV signaling with programmable damping architecture has been described.

We claim:

1. A programmable damping circuit for controlling damping factor of a phase-locked loop, the programmable damping circuit comprising:

a phase detector having an input for receiving an input signal of said programmable damping circuit;

a charge pump coupled to an output of said phase detector;

a loop filter consisting of a capacitor coupled directly to a first terminal at an output of said charge pump, and at a second terminal to ground;

a summing node coupled to said first terminal of said loop filter capacitor;

a variable gain amplifier having an input coupled to said output of said phase detector, said variable gain amplifier having an output coupled to said summing node, said variable gain amplifier having a gain controlled by a control signal, wherein a voltage of an output signal provided by said summing node is adjusted by controlling said gain of said variable gain amplifier for controlling said damping factor of said phase-locked loop.

2. The circuit of claim 1 wherein said charge pump comprises a transconductance element.

3. The circuit of claim 2 wherein said phase detector is a type B phase detector.

4. The circuit of claim 1 wherein said phase detector is a type B phase detector.

5. The circuit of claim 3 wherein said type B phase detector is used in a sampled data system.

6. The circuit of claim 3 wherein said sampled data system is a Partial Response Maximum Likelihood channel for hard disk drives.

7. The circuit of claim 1 wherein said charge pump is a transconductance type charge pump.

8. The circuit of claim 3 wherein said charge pump is a transconductance type charge pump.

9. The circuit of claim 4 wherein said type B phase detector is used in a sampled data system.

10. The circuit of claim 9 wherein said sampled data system is a Partial Response Maximum Likelihood channel for hard disk drives.

11. The circuit of claim 4 wherein said charge pump is a transconductance type charge pump.

* * * * *